(12) United States Patent
Hagen

(10) Patent No.: US 6,949,405 B2
(45) Date of Patent: Sep. 27, 2005

(54) METHOD FOR PRODUCING CHANNELS AND CAVITIES IN SEMICONDUCTOR HOUSINGS, AND AN ELECTRONIC COMPONENT HAVING SUCH CHANNELS AND CAVITIES

(75) Inventor: Robert-Christian Hagen, Sarching (DE)

(73) Assignee: Infineon Technologies AG, Munich (DE)

( * ) Notice: Subject to any disclaimer, the term of this patent is extended or adjusted under 35 U.S.C. 154(b) by 95 days.

(21) Appl. No.: 10/679,086

(22) Filed: Oct. 2, 2003

(65) Prior Publication Data

US 2004/0067603 A1 Apr. 8, 2004

(30) Foreign Application Priority Data

Oct. 2, 2002 (DE) .......................................... 102 46 283

(51) Int. Cl.[7] .......................... H01L 21/44; H01L 21/48; H01L 31/0203; H01L 29/84
(52) U.S. Cl. .......................... 438/106; 438/116; 438/48; 438/64; 438/49; 438/50; 257/415; 257/433; 257/E33.056

(58) Field of Search ................................ 438/106, 116, 438/48–50, 56, 64; 257/415, 431, 433, E33.05

(56) References Cited

U.S. PATENT DOCUMENTS

| 5,424,249 A | 6/1995 | Ishibashi |
| 6,049,120 A | 4/2000 | Otani et al. |
| 2003/0141561 A1 * | 7/2003 | Fischer et al. .............. 257/415 |

FOREIGN PATENT DOCUMENTS

| DE | 42 19 575 A1 | 7/1993 |
| DE | 197 26 839 A1 | 7/1998 |
| DE | 199 29 025 A1 | 12/2000 |

* cited by examiner

*Primary Examiner*—Craig A. Thompson
(74) *Attorney, Agent, or Firm*—Laurence A. Greenberg; Werner H. Stemer; Ralph E. Locher

(57) ABSTRACT

An electronic component is produced by incorporating a sacrificial part in a plastic housing shape. After molding, the sacrificial part is etched out or otherwise removed from the completed plastic housing. As a result, channels and/or cavities can be formed in the plastic housing in order to allow access to sensor areas on the semiconductor chip.

24 Claims, 4 Drawing Sheets

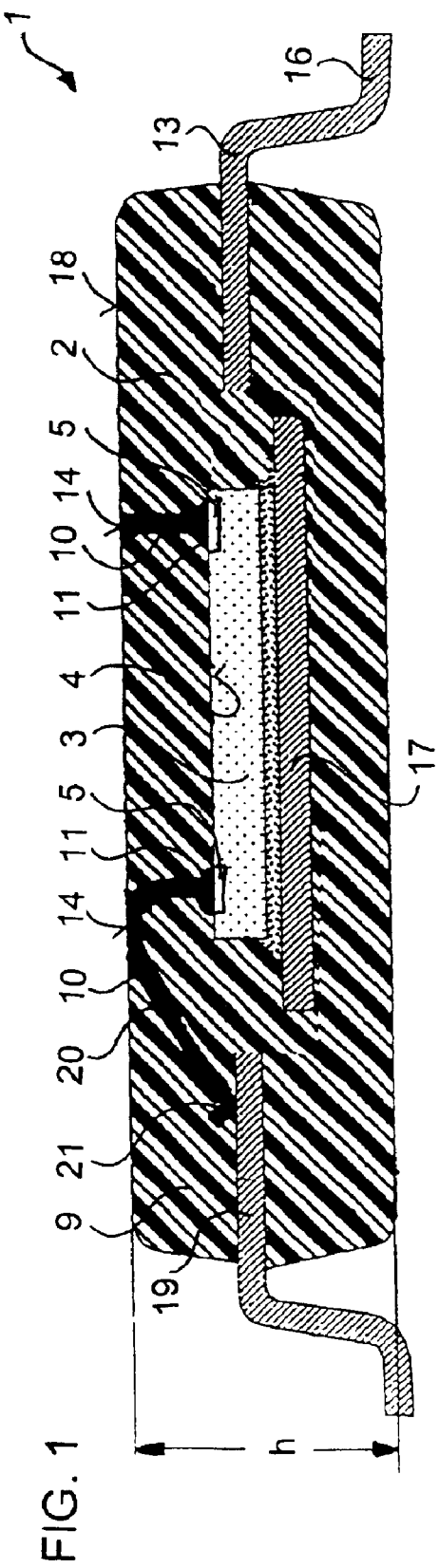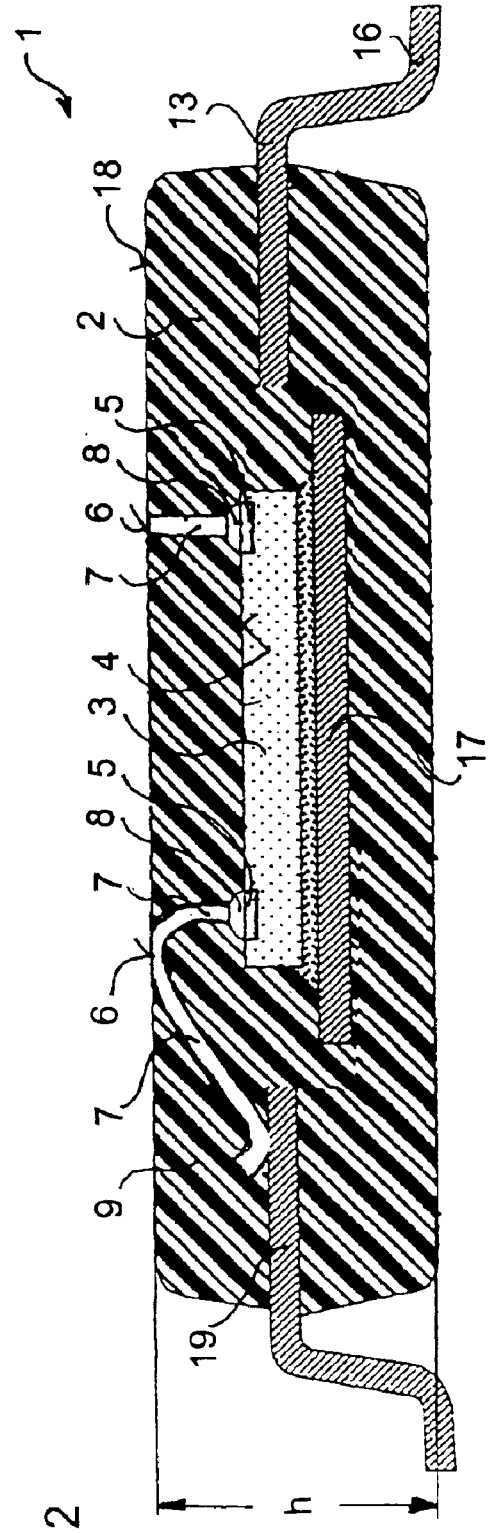

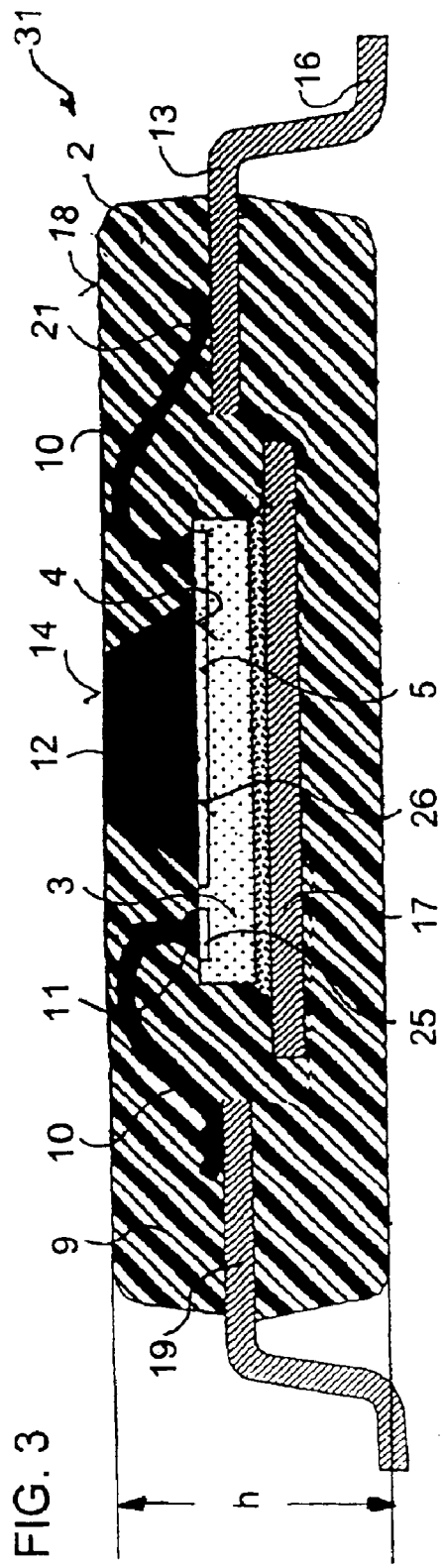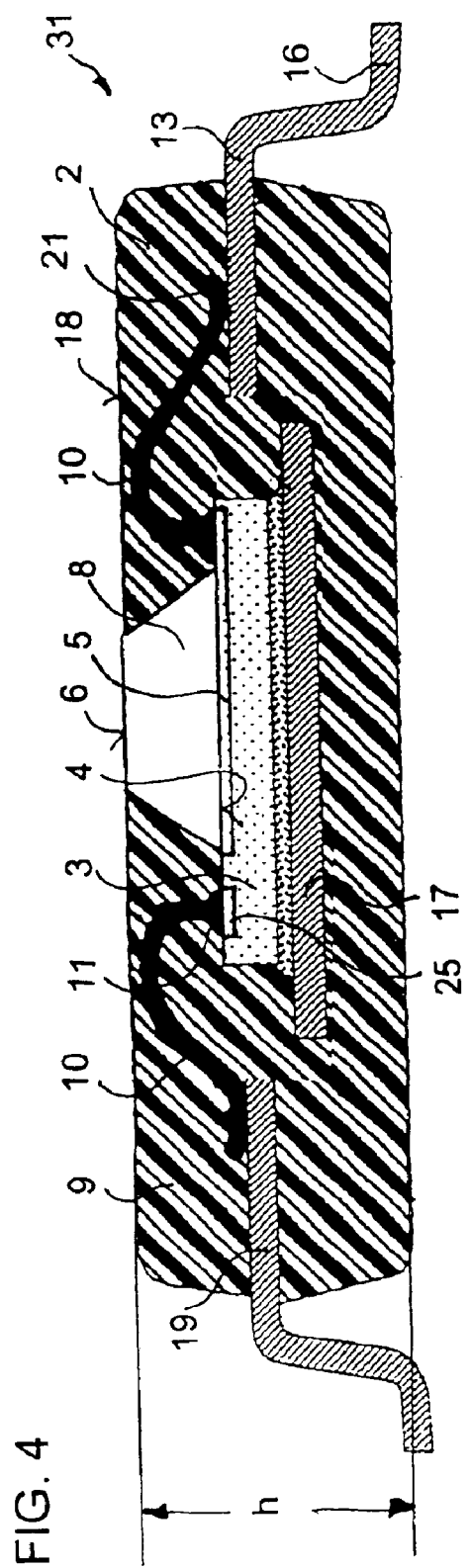

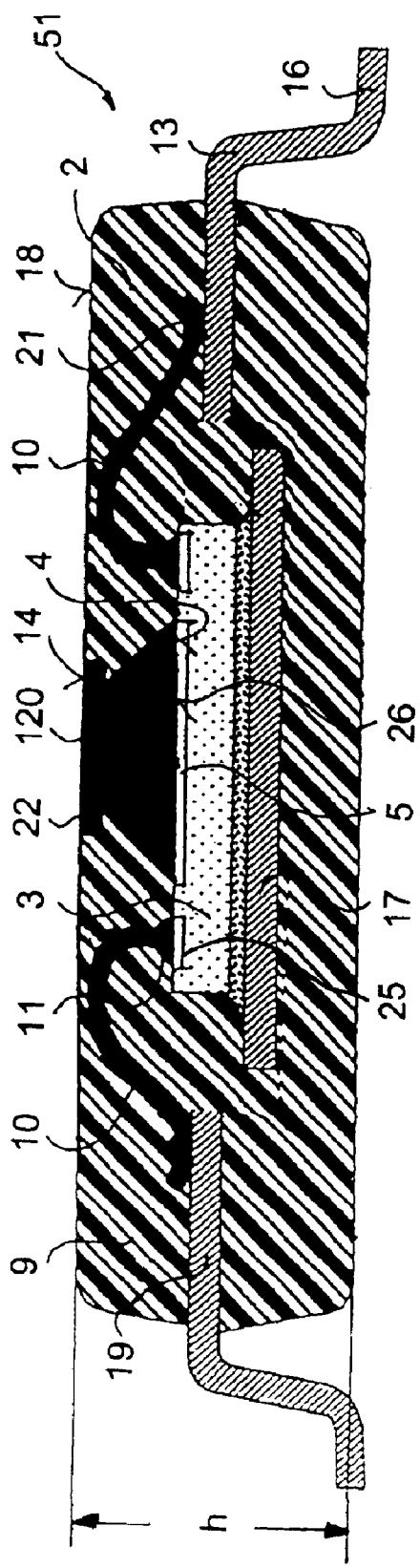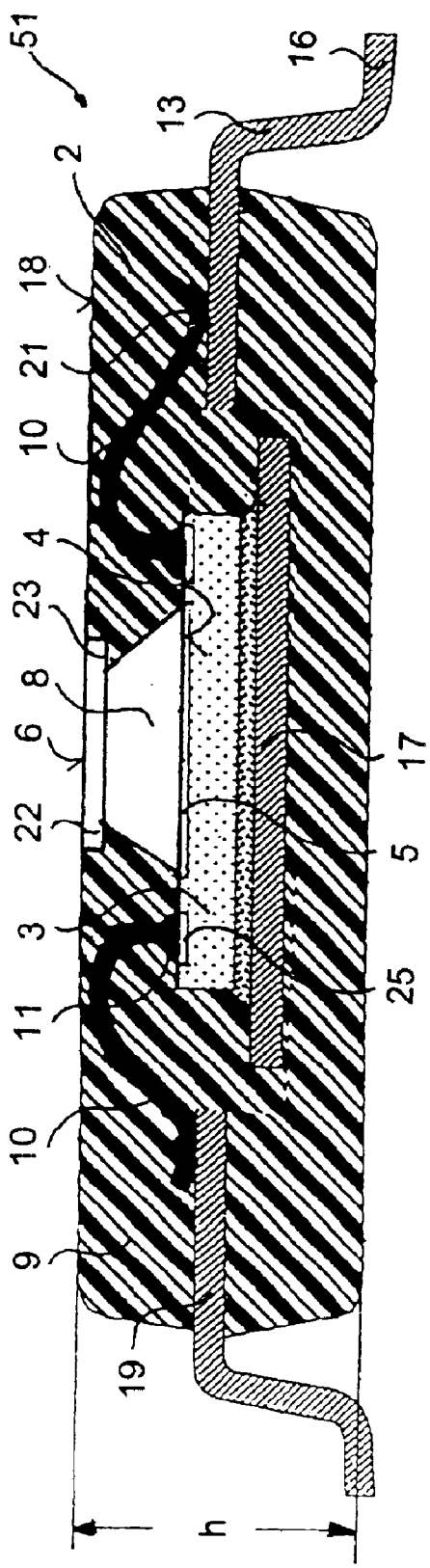

METHOD FOR PRODUCING CHANNELS AND CAVITIES IN SEMICONDUCTOR HOUSINGS, AND AN ELECTRONIC COMPONENT HAVING SUCH CHANNELS AND CAVITIES

BACKGROUND OF THE INVENTION

Field of the Invention

The invention relates to a method for producing channels and cavities in plastic housings having semiconductor chips, for supplying liquids, pressures, gases or optical signals to the semiconductor chip. The invention also relates to an electronic component having such channels and/or cavities.

Semiconductor chips with integrated sensors are now being used increasingly rather than combinations of evaluation circuits with external sensors. Semiconductor chips such as these are particularly suitable for measuring gas flow rates and gas pressures, as well as liquid flow rates and liquid pressures. For this purpose, the liquids and gases can be passed over resistance structures on a semiconductor chip and produce signals which provide information about the flow direction, about the strength of the flow and about the pressure. Housings for sensor such as these are costly to manufacture and are relatively complex.

SUMMARY OF THE INVENTION

It is accordingly an object of the invention to provide a method for producing an electronic component having a sensor on a semiconductor chip in a plastic housing which overcomes the above-mentioned disadvantages of the heretofore-known devices and methods of this general type and which provides for a component that can be manufactured at low cost and which avoids the risk of scrap with complex housing shapes.

With the foregoing and other objects in view there is provided, in accordance with the invention, a method for producing an electronic component, which comprises the following method steps:

providing a semiconductor chip on a circuit mount, the semiconductor chip having an active upper face with at least one sensor area;

applying a sacrificial part to the sensor area of the semiconductor chip;

introducing the semiconductor chip with the circuit mount and the sacrificial part into an injection-molding mold;

filling the injection-molding mold with a plastic housing compound, for embedding the components in the injection-molding mold, and for forming packaged components;

removing the packaged components from the injection-molding mold; and etching out or removing the sacrificial part from the plastic housing compound, for forming at least one void (e.g., channels, cavities) in the plastic housing compound.

In accordance with a preferred mode of the invention, the sacrificial part has an area element and the semiconductor chip with the circuit mount and the sacrificial part is introduced into the injection-molding mold such that the area element of the sacrificial part touches an inner wall of the injection-molding mold.

With the above and other objects in view there is also provided, in accordance with the invention, an electronic component, comprising:

at least one semiconductor chip having an active upper face with at least one sensor area; and a plastic housing enclosing the at least one semiconductor chip, the housing having a void formed therein extending between an opening on a surface of the plastic housing and the at least one sensor area on the semiconductor chip, the void being formed with an undercut in a direction towards the sensor area of the semiconductor chip or the component is formed with one or more three-dimensionally curved channels.

According to the invention, a method is specified for producing an electronic component, comprising the following method steps. First of all, a semiconductor chip is provided on a circuit mount, with the semiconductor chip having at least one sensor area on its active upper face. A sacrificial part is applied to this sensor area of the semiconductor chip. The semiconductor chip which has been prepared in this way is then introduced with a circuit mount and with an applied sacrificial part into an injection-molding mold. In the process, one area element of the sacrificial metal may touch an inner wall of the injection-molding mold. Once the injection-molding mold has been closed, it is filled with a plastic compound, with the components that have been introduced into the injection-molding mold being embedded. Once the plastic housing compound has cooled down, the packaged components can be removed from the injection-molding mold. The sacrificial part is then etched out or removed from the plastic housing compound, forming at least one channel and/or a cavity. The sacrificial part may be produced from metal, plastic or from some other suitable material.

For this method, the circuit mount may have two or more component positions, with a semiconductor chip having at least one sacrificial part being positioned in each of the component positions. A circuit mount such as this may then be encapsulated in a large injection-molding mold to form a plastic housing panel with two or more component positions. This results in the production of a blank which has a sacrificial part in each component position, with this sacrificial part running from an exposed area element on the upper face to the sensor area of each semiconductor chip. These sacrificial parts can then be etched out or removed from the plastic panel at the same time, in a subsequent etching step or dissolving step.

The advantages of this method are that the plastic housing does not need to be assembled from a number of individual pieces. At the same time, the channels can be routed and the cavities formed as required. This is because the geometry of the channels and of the cavities is essentially governed by the geometry of the sacrificial part. This method makes it possible to produce channels and/or cavities whose cross section increases towards the sensor area of the semiconductor chip. It is even possible to produce curved channels, which can connect different sensor areas on a semiconductor chip to one another.

The application of a sacrificial part can be made simpler and more economic by carrying out this application process together with the bonding of bonding wires in order to make contact with the semiconductor chip. The sacrificial parts may also be applied in advance or retrospectively, using a separate bonding or adhesive-bonding method, for example using different materials or wire diameters. In this case, bonding wires which are intended to be used as a sacrificial part are mounted on the sensor area of the semiconductor chip by means of bonding, forming a bonding head or bonding clip. These bonding wires are then lengthened such that they project beyond a predetermined plastic packaging height. This method has the advantage that conventional bonding systems can be used in order to prepare etched channels and/or etched cavities. When bonding connections which have been prepared in this way are introduced into an injection-molding mold, the bonding wires which project beyond the plastic packaging height touch the inner wall of the injection-molding mold, so that they are not covered by the plastic compound on the touching surface when the injection-molding mold is filled with a plastic housing compound. Once the packaged components have been removed from the injection-molding mold, the process of etching out the bonding wires can then be carried out from these exposed area elements of the bonding wires, thus resulting in etched channels and/or etched cavities.

During the bonding process, the bonding wires form either a bonding head or a bonding clip. In both cases, characteristic etched channels or etched cavities are produced, which characterize the method according to the invention. The bonding wires produce an entire channel system. Organic sensors, for example equilibrium organs such as the vestibular organ, may be simulated by etched channels arranged in an annular shape in the edge area of a semiconductor chip.

Instead of bonding structures as sacrificial parts, it is also possible to adhesively bond preshaped sacrificial parts having the desired geometric shape onto corresponding sensor areas of the semiconductor chip, which can be carried out with less risk of damage than soldering. In this way, vibration bars, which are sensitive to being fractured, of an acceleration sensor can be reliably connected to a cavity. Mechanically sensitive areas such as these may be connected to sacrificial parts by means of an adhesive bonding technique and, after being encapsulated in a plastic housing compound, these sensor areas (which were initially covered by the sacrificial part) can then be exposed by etching out or removing the sacrificial part, as well as the adhesive, forming cavities.

The sacrificial part can also be soldered onto the sensor area of the semiconductor chip. This soldering process can be carried out at the same time as the soldering process of the passive rear face of the semiconductor chip onto a chip island provided that, at the same time, a sacrificial part which is provided with a layer that can be soldered is applied to the active upper face of the semiconductor chip, in its sensor area.

Once the packaged components have been removed from the injection-molding mold, the plastic housing compound on those area elements of the sacrificial part which originally touched the inner wall may have solidified. In this situation, defects can be avoided if an area element of the sacrificial part is exposed before the etching out or removal of the sacrificial part, for example by dissolving the plastic housing compound or by a mechanical removal step, such as laser erosion, water jet erosion or a grinding step.

Another possible way to avoid defects is to cover the inner wall of the injection-molding mold with a sheet before the components to be packaged are introduced into the injection-molding mold. When the injection-molding mold is closed, the projecting area element of the sacrificial part may project into this sheet, thus being protected against being coated in an undesirable manner by the plastic housing compound.

The plastic housing compound is preferably injected into the injection-molding mold at a relatively high pressure of 10 to 15 MPa. This high pressure ensures that the fine structures of the bonding connections to be embedded and the semiconductor chip are completely encased with the plastic housing compound, with gaps or bubbles in the plastic housing compound being avoided. Before the process of injection into the injection-molding mold is carried out, a plastic housing compound such as this is prepared at a raised temperature, preferably by mixing polymer plastic up to a filling level of between 60 and 95% by weight with ceramic particles or soot particles. A highly filled polymer plastic such as this is, on the one hand, resistant to the metal etching solutions or plastic solvents that will be used for the etching-out process, in particular due to the large proportion of ceramic particles and, furthermore, the large proportion of ceramic particles in the plastic housing compound ensures that the thermal expansion behavior of the plastic housing compound is matched to the thermal expansion behavior of the semiconductor chip.

In a further implementation example of the method, a thermosetting plastic, such as an epoxy resin, is used instead of the thermoplastic polymer plastic and, before the plastic housing compound is injected into the injection-molding mold, it is mixed with a filling level of between 60 and 95% by weight with ceramic particles and/or soot particles.

After the removal of the packaged components from the injection-molding mold and after the plastic housing compound has been removed, if and where necessary, from the area elements of the sacrificial part, the sacrificial part is selectively dissolved in a metal etching solution or in a plastic solvent. The composition of a metal etching solution depends on the material of the sacrificial metal. A sacrificial part composed of aluminum alloys can be removed from the solidified plastic housing compound by using a potassium lye. More aggressive etching baths, such as aqua regia, are required for sacrificial parts composed of gold alloys.

One further possible way to selectively remove the sacrificial part is to use a dry etching technique. This can be done by processing the sacrificial part using a plasma composed of reactive gases. Gases containing chlorine are suitable for use as reactive gases such as these for a majority of metals, in particular for aluminum alloy, which dissolve the sacrificial part from the plastic housing compound with a high dry etching rate, and leave behind them a corresponding etched channel and/or an etched cavity in the plastic housing compound.

The invention provides an electronic component having a plastic housing which has at least one semiconductor chip. The semiconductor chip has at least one sensor area on its active upper face. The plastic housing has at least one opening to a channel and/or to a cavity in a molded plastic compound. The channel and/or the cavity end/ends on the at least one sensor area of the semiconductor chip. In this case, the channel or the cavity may widen or else, if required, narrow in the direction of the semiconductor chip, forming an undercut. An electronic component such as this with a channel and/or a cavity has the advantage that the plastic housing is not composed of a number of different housing structures. The capability according to the invention to incorporate channels and/or cavities in a plastic housing with a predetermined geometry thus makes it possible to form a relatively complex sensor housing on the basis of a small number of components.

One advantageous special feature is that the channel and/or the cavity may have a cross section which is larger toward the sensor area than is the opening in the surface of the plastic housing. This advantageously makes it possible to produce sensors whose media exchange with the environment, such as liquids or gases, can be optimized by the ratio of the size of the opening to the size of the sensor area. It is also possible to connect two or more openings one behind the other in the plastic housing compound in order to produce geometries which allow the measurement of flow velocities and flow rates of gases and/or liquids.

The electronic component may also have three-dimensionally curved channels, and this has the advantage that the flow resistance for gases and liquids in the channels can be varied. Different radii of curvature also allow different flow effects to be achieved.

The sensor area of a semiconductor chip such as this may be designed such that it acts as a pressure sensor, as a gas sensor, as a liquid sensor, as an acceleration and/or as a photosensor. An evaluation circuit can be connected directly to the sensor area of the semiconductor chip and can be connected via appropriate connections to external contacts on the semiconductor component. Flow directions, flow pressures, flow rates and other media parameters can be determined using two or more such sensors in conjunction with a cavity, and corresponding openings in the plastic housing compound.

The invention is particularly advantageous for photosensors. This is because the cavity and, in particular, the opening on the surface may be matched to the shape of a convergent lens, so that the photosensor together with the housing represents a complete microscopic camera. The channel and/or the cavity are in the form of a prefabricated sacrificial part which is encapsulated in the plastic housing compound and whose freely accessible area element on the outside of the plastic housing compound is smaller than its cross-sectional area in the sensor area. Geometrically preshaped sacrificial parts such as these may assume any desired shape since they are etched out of the plastic housing compound once the latter has been molded, and leave behind a channel and/or a cavity.

A part of the channel and/or of the cavity may be in the form of a bonding wire and/or a bonding head and/or a bonding clip. These three different embodiments of a bonding wire connection result form the way wherein a bonding wire can intrinsically be mounted on the semiconductor chip. On the one hand, it can be formed as a bonding clip on a contact surface, with the microscopic welding point for the bonding connection being located in the area wherein the bonding clip has its greatest curvature. On the other hand, the bonding wire may form a bonding head by premelting the bonding wire to form a droplet before the bonding wire is applied to a corresponding sensor surface on the semiconductor chip, and with this droplet then forming a bonding head on the contact surface in a microscopic welding process, by means of thermal compression bonding.

The bonding wire that is arranged between the bonding clip and bonding head may be routed from one bonding clip to another or from a bonding head to a bonding clip in order to form etched channels with any desired three-dimensional curvature. This embodiment of the invention allows extremely thin etched channels to be provided in the plastic housing compound. On the other hand, it is also possible to use bonding strips, which then result in etched channels with a virtually rectangular cross section in the plastic housing compound.

Since bonding connections are also required in order to pass the sensor signals out of the semiconductor chip to corresponding external contact surfaces, the preparation of the etched channels and/or etched cavities does not necessarily involve a separate bonding step. The invention thus results in a low-cost electronic component which has channels and/or cavities which are connected to sensor areas on the active upper face of a semiconductor chip, and which may have virtually any desired geometry that is matched to the sensor area.

In summary, it can be stated that the need for additional openings in a semiconductor chip housing for detection and evaluation of pressures, optical signals, gases and/or liquids is increasing all the time. In order to satisfy this need at low cost, the present invention avoids complex housings composed of a number of prefabricated and assembled plastic injection-molded parts. In fact, a semiconductor housing can be produced integrally by using a transfer molding process.

Before the actual injection-molding process with a plastic housing compound, geometric bodies in the form of sacrificial parts are introduced between the semiconductor chip and the injection-molding mold at various points and in that geometric shape at which openings are provided with adjacent channels for the subsequent supply of pressures, optical signals, gases or liquids. An initial area of this sacrificial body is arranged on the sensor area of the semiconductor chip, and an end area is positioned at the edge of the injection-molding mold. This sacrificial part has a geometry such that a channel and/or a cavity with accurate dimensions can be formed, ending at the sensor area of the semiconductor chip. Once the injection-molding process has been completed, the sacrificial part is removed, so that channels and/or cavities are left behind.

The sacrificial part can be introduced by means of bonding wires, with the first bonding contact being produced on the chip and the bonding wire then being passed to the edge of the subsequent injection-molded body. Pure metal wires and/or alloys of two or more metals can be used as a bonding wire for this purpose. The bonding wire routing allows any desired etched channel routing and no parts that are specific to the physical shape are required to produce the housing with an opening to sensor areas on a semiconductor chip. Furthermore, one wire bonder may produce a first and a second bonding contact, with the wire clip being designed such that the highest point on the bonding wire clip is located at the edge of the subsequent injection-molded body. When the injection-molding mold is closed, wires that have been drawn up and bent up in this way are pressed against the inner wall of the injection-molding mold, and are thus calibrated.

A further possible way to provide channels and/or cavities in a semiconductor housing compound is to adhesively bond, solder or likewise bond in place preshaped parts with which the semiconductor chip is fitted. After the process of embedding the semiconductor chip with the sacrificial parts, these sacrificial parts can be removed from the plastic housing without leaving any residue. This process may be carried out by using wet-chemical or dry-etching processes, or plasma incineration. In the case of plasma incineration, a plasma is produced from reactive gases which convert the sacrificial part into gaseous components without leaving any residue, and with these gaseous components being pumped out in the plasma incineration system. If the free ends of the sacrificial parts or of the bonding wires that have been introduced are covered with a thin film composed of molding compound, then this thin film can be removed by means of pressurized water jets, sand blasting, laser beams or by dissolving it chemically, thus exposing those area elements from which channels and/or cavities can then be introduced into the plastic housing compound.

Other features which are considered as characteristic for the invention are set forth in the appended claims.

Although the invention is illustrated and described herein as embodied in a method for producing channels and cavities in semiconductor housings, and an electronic component having such channels and cavities, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 is a schematic cross section through a first electronic component according to the invention;

FIG. 2 shows the first electronic component of FIG. 1 after the removal of bonding wires;

FIG. 3 is a schematic cross section through a second electronic component according to the invention;

FIG. 4 shows the second electronic component of FIG. 3, after the removal of a sacrificial part;

FIG. 5 is a schematic cross section through a third electronic component according to the invention;

FIG. 6 shows the third electronic component of FIG. 5, after the removal of a sacrificial part.

DESCRIPTION OF THE PREFERRED EMBODIMENTS

Figure 7:
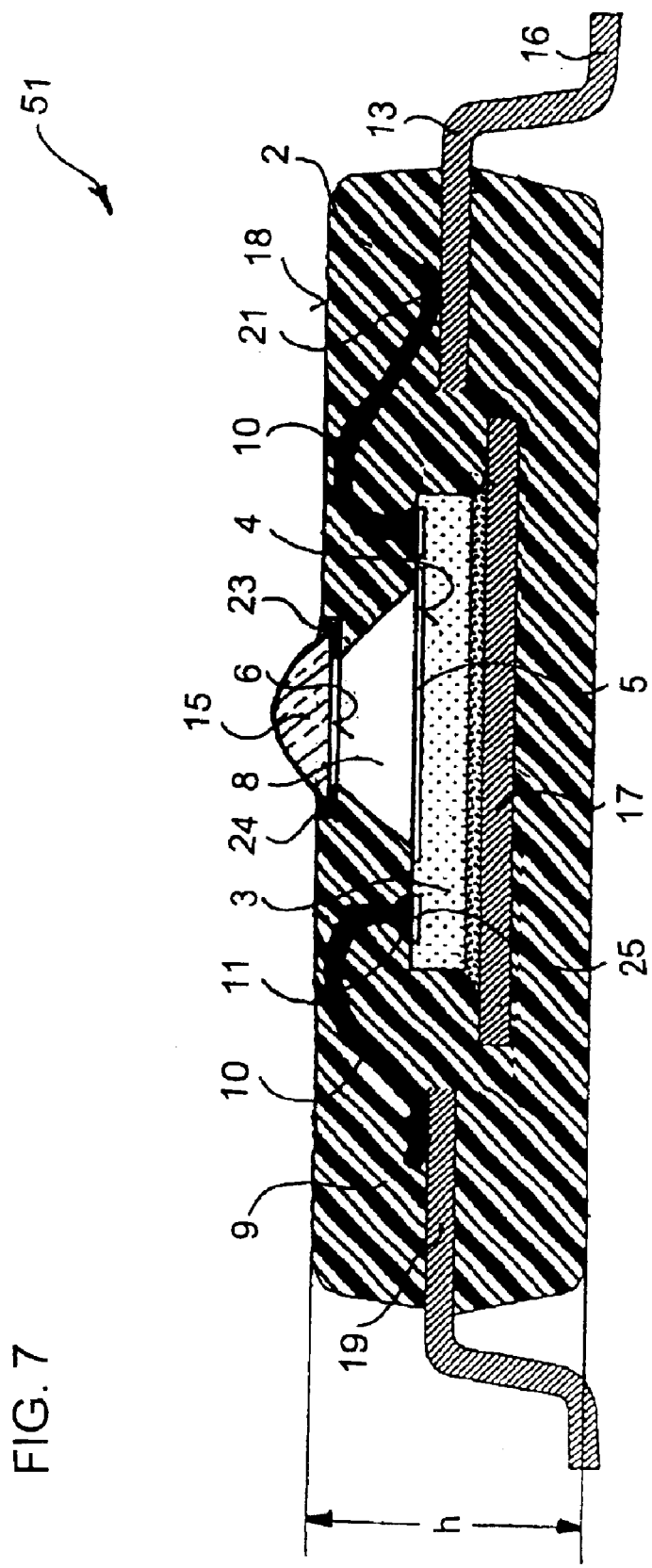
FIG. 7 shows the third electronic component of FIG. 6, after the fitting of an optical lens to an opening of an etched cavity.

Referring now to the figures of the drawing in detail and first, particularly, to FIG. 1 thereof, there is shown a schematic cross section through a first electronic component 1. The first electronic component 1 has a plastic housing 2 with a plastic housing package height h. Outer flat conductors 16 of a circuit mount 13 project out of the plastic housing 2, merge within the plastic housing 2 into inner flat conductors 19, some of which are connected via bonding wires 10 to the active upper face 4 of a semiconductor chip 3. The semiconductor chip 3 is disposed on a chip island 17 on the circuit mount 13. In this cross-sectional view, the bonding wires 10 form a geometric body as a sacrificial part, which then, as is shown in FIG. 2, forms a part of a detector, with etched channels and etched cavities being left behind. To this end, a sensor area 5 on the right-hand side edge of the semiconductor chip 3 is covered by a first bonding contact in the form of a bonding head 11, whose bonding wire 10 is routed directly to the upper face 18 of the first electronic component 1. A bonding head 11 such as this is mounted on the sensor area 5, and its associated bonding wire 10 is routed to the upper face 18 of the first electronic component 1. This arrangement of a bonding head 11 with a bonding wire 10 results in a vertical etched channel being formed in the sensor area 5 of the semiconductor chip 3, and then widened to form an etched cavity when the vertically arranged bonding wire 10 and the bonding head 11 are subsequently etched out of the plastic housing compound 9.

A further bonding wire 10 is arranged on the left-hand side in FIG. 1, has a bonding head 11 on the sensor area 5 of the semiconductor chip 3, and forms a drawn-up wire clip 20, which merges into a bonding clip 21 on the inner flat conductor 19. The drawn-up wire clip 20 is designed such that its highest point is located on the upper face 18 of the plastic housing 2 and forms an area element 14 which is not covered by plastic housing compound 9. The bonding wires that are not shown here and which are used for making electrical contact between the semiconductor chip 3 and the outer flat conductors 16 should not, of course, be used as a sacrificial part. This is due to the fact that they do not emerge on the upper face 18, so that they are protected against external influences.

FIG. 2 shows a schematic cross section through the first electronic component 1 as shown in FIG. 1, after removal of the two bonding wires 10.

The bonding wires 10, shown in FIG. 1, are removed from the plastic housing compound 9 without any residue by using a metal etching solution. The etched channels 7 and etched cavities 8 that are formed during this process are geometrically in the form of etched-out bonding connections. Any desired channel routing that corresponds to the requirements for the sensor area 5 is thus possible. A sensor area 5 such as this may have structures which, by means of etched channels that are connected one behind the other, emit flow directions, flow pressures and flow rates of liquids and/or gases via the outer flat conductors 16, as electrical signals. Curved etched channels, such as those which can be seen in FIG. 2, in this case increase the flow resistance. Furthermore, the etched cavity 8 has a larger cross section above the sensor area 5 than does the opening 6 on the right-hand side of FIG. 2 in the plastic housing 2 of the first electronic component 1.

FIG. 3 shows a schematic cross section through a second electronic component 31 having an area element 14, which is not covered by plastic housing compound 9, of a first sacrificial part 12. Components with the same functions as in the previous figures are identified by the same reference symbols, and will not be explained once again.

The first sacrificial part 12 widens conically in the direction of the sensor surface 5 of the semiconductor chip 3. This first sacrificial part 12 is adhesively bonded onto the sensor area 5 of the semiconductor chip 3. The area element 14 is smaller than the adhesively bonded area 26 to the sensor area 5 of the semiconductor chip 3. The sensor area 5 of the semiconductor chip 3 is in the form of a photodiode in this embodiment of the invention.

FIG. 4 shows a schematic cross section through the second electronic component 31 as shown in FIG. 3, after the removal of the first sacrificial part 12.

After the removal of the first sacrificial part 12, an opening 6 is produced in the upper face 18 of the plastic housing 2, and this opening 6 is part of an etched cavity 8 which ends on the upper face 4 of the sensor area 5 of the semiconductor chip 3. Light can pass through the opening 6 to strike the sensor area 5, and the intensity of this light can be measured as a photovoltage on the outer flat conductors 16. The method according to the invention thus allows etched cavities 8 to be introduced into a plastic housing 2, with the cross sections of these etched cavities 8 increasing toward the housing center or toward the semiconductor chip 3.

FIG. 5 shows a schematic cross section through a third electronic component 51 with an area element 14, which is not covered by the plastic housing compound 9, of a second sacrificial part 120. Components with the same functions as in the previous figures are identified by the same reference symbols, and will not be explained once again.

This second sacrificial part 120 differs from the first sacrificial part 12 as shown in FIG. 3 in that, in addition to the conical profile of the sacrificial body as shown in FIG. 3, an extension 22 in the form of a disk is provided in the region of the area element 14, thus resulting in a complex molding.

FIG. 6 shows a schematic cross section through the third electronic component 51 shown in FIG. 5, after removal of the second sacrificial part 120.

The removal of the second sacrificial part 120, which is shown in FIG. 5, results in an exactly structured etched cavity 8 in the plastic housing 2, with the extension 22, which is in the form of a disk, of the second sacrificial part 120 in FIG. 5 now producing an attachment 23 in the etched cavity 8, so that the conically widening cavity can be covered, for example, by a glass window in order to protect the photodiode in the sensor area 5 of the semiconductor chip 3.

FIG. 7 shows a schematic cross section through the third electronic component 51 as shown in FIG. 6, after the fitting of an optical lens 15 to an opening 6 in the etched cavity 8.

A lens 15 can be applied by means of an adhesive bead 24 to the attachment 23 instead of using a simple, transparent glass window, thus producing a light focusing effect and, with appropriate structuring of the active upper face of the semiconductor chip 3, resulting in a microscopic camera.

It is also feasible for the etched cavity 8 to be filled before the closure process with a substance, for example with a liquid having the desired optical characteristics.

The contact surfaces 25 shown here and which are connected to the outer flat conductors 16 do not correspond to the actual relationships, but are illustrated in an enlarged form here, for presentation reasons.

I claim:

1. A method for producing an electronic component, which comprises the following method steps:
   providing a semiconductor chip on a circuit mount, the semiconductor chip having an active upper face with at least one sensor area;
   applying a sacrificial part to the sensor area of the semiconductor chip;
   introducing the semiconductor chip with the circuit mount and the sacrificial part into an injection-molding mold;
   filling the injection-molding mold with a plastic housing compound, for embedding the components in the injection-molding mold, and for forming packaged components;
   removing the packaged components from the injection-molding mold; and
   etching out or removing the sacrificial part from the plastic housing compound, for forming at least one void in the plastic housing compound.

2. The method according to claim 1, wherein the void is selected from the group of channels and cavities.

3. The method according to claim 1, wherein the sacrificial part has an area element and which comprises introducing the semiconductor chip with the circuit mount and the sacrificial part into the injection-molding mold, with the area element of the sacrificial part touching an inner wall of the injection-molding mold.

4. The method according to claim 1, which comprises providing a bonding wire or a bonding strip as the sacrificial part and mounting the sacrificial part by bonding on the sensor area of the semiconductor chip.

5. The method according to claim 1, which comprises adhesively bonding the sacrificial part onto the sensor area of the semiconductor chip.

6. The method according to claim 1, which comprises covering the inner wall of the injection-molding mold with a sheet before introducing the components to be packaged into the injection-molding mold, such that the projecting area element of the sacrificial part projects into the sheet when the injection-molding mold is closed.

7. The method according to claim 1, wherein, after the step of removing the packaged components from the injection-molding mold, an area element of the sacrificial part is not covered by the plastic housing compound.

8. The method according to claim 1, which comprises removing the sacrificial part selectively by way of an etching solution or a dry etching process.

9. The method according to claim 1, which comprises removing the sacrificial part selectively by way of a dry etching process in a plasma composed of reactive gases.

10. An electronic component, comprising:
    at least one semiconductor chip having an active upper face with at least one sensor area; and
    a plastic housing enclosing said at least one semiconductor chip, said housing having a void formed therein extending between an opening on a surface of said plastic housing and said at least one sensor area on said semiconductor chip, said void being formed with an undercut in a direction towards said sensor area of said semiconductor chip.

11. The electronic component according to claim 10, wherein said void is one or more three-dimensionally curved channels.

12. The electronic component according to claim 10, wherein said void is a channel or a cavity.

13. The electronic component according to claim 10, wherein said void has a larger cross section toward said sensor area than said opening.

14. The electronic component according to claim 10, wherein said sensor area is a part of a pressure sensor, a gas sensor, a liquid sensor, an acceleration sensor, or a photosensor.

15. The electronic component according to claim 10, wherein said void has an external contour of a preshaped sacrificial part encapsulated in a plastic housing compound forming said housing.

16. The electronic component according to claim 10, wherein at least one part of said void has an external contour of a bonding wire, of a bonding head, or of a bonding clip.

17. The electronic component according to claim 10, wherein said housing is formed of a plastic housing compound having ceramic particles up to a filling level of between 60 and 95% by weight, and a polymer plastic or an epoxy resin.

18. An electronic component, comprising:
    at least one semiconductor chip having an active upper face with at least one sensor area; and
    a plastic housing enclosing said at least one semiconductor chip, said housing having at least one three-dimensionally curved channel formed therein extending between an opening on a surface of said plastic housing and said at least one sensor area on said semiconductor chip.

19. The electronic component according to claim 18, wherein said channel is formed with an undercut in a direction towards said sensor area of said semiconductor chip.

20. The electronic component according to claim 18, wherein said channel has a larger cross section toward said sensor area than said opening.

21. The electronic component according to claim 18, wherein said sensor area is a part of a pressure sensor, a gas sensor, a liquid sensor, an acceleration sensor, or a photosensor.

22. The electronic component according to claim 18, wherein said channel has an external contour of a preshaped sacrificial part encapsulated in a plastic housing compound forming said housing.

23. The electronic component according to claim 18, wherein at least one part of said channel has an external contour of a bonding wire.

24. The electronic component according to claim 18, wherein said housing is formed of a plastic housing compound having ceramic particles up to a filling level of between 60 and 95% by weight, and a polymer plastic or an epoxy resin.

* * * * *